United States Patent
Tang (10) Patent No.: US 12,454,958 B1
(45) Date of Patent: Oct. 28, 2025

(54) FAN BRAKE MECHANISM

(71) Applicant: ASIA VITAL COMPONENTS CO., LTD., New Taipei (TW)

(72) Inventor: Chih Cheng Tang, New Taipei (TW)

(73) Assignee: ASIA VITAL COMPONENTS CO., LTD., New Taipei (TW)

( * ) Notice: Subject to any disclaimer, the term of this patent is extended or adjusted under 35 U.S.C. 154(b) by 0 days.

(21) Appl. No.: 18/983,528

(22) Filed: Dec. 17, 2024

(30) Foreign Application Priority Data

Nov. 12, 2024 (TW) .................. 113143400

(51) Int. Cl.
*F04D 27/00* (2006.01)
*F04D 19/00* (2006.01)
*H05K 7/20* (2006.01)

(52) U.S. Cl.
CPC ......... *F04D 27/004* (2013.01); *F04D 19/002* (2013.01); *H05K 7/20172* (2013.01)

(58) Field of Classification Search
None
See application file for complete search history.

(56) References Cited

U.S. PATENT DOCUMENTS

| 4,970,998 | A | 11/1990 | Inc | |
|---|---|---|---|---|
| 10,422,347 | B2 * | 9/2019 | Sun | F04D 29/522 |
| 2018/0231074 | A1 * | 8/2018 | Sun | F04D 25/0613 |
| 2024/0044337 | A1 * | 2/2024 | Tang | F16D 63/006 |

FOREIGN PATENT DOCUMENTS

| TW | M661422 U | 10/2024 |
|---|---|---|
| TW | M665927 U | 1/2025 |
| WO | 2023144133 A1 | 3/2023 |

OTHER PUBLICATIONS

Tang TW-M661422-U + machine translation (Year: 2024).*
Search Report dated Apr. 29, 2025 issued by Taiwan Intellectual Property Office for counterpart application No. 113143400.

* cited by examiner

*Primary Examiner* — Juan G Flores
(74) *Attorney, Agent, or Firm* — Demian K. Jackson; Jackson IPG PLLC (57) ABSTRACT

A fan brake mechanism includes a fan unit and a brake unit. The fan unit includes a frame and fan blades. The frame includes a vertically extending shaft barrel, and the fan blades are vertically mounted on a shaft with a pivot portion positioned within the shaft barrel. The brake unit includes a brake base and a brake module. The brake base is provided with brake pawls, and the brake module includes a body portion, at least one movable member accommodated within the body portion, and a limit pin corresponding to the movable member. The body portion includes a through groove that engages with the pivot portion, allowing the brake module to pivot on the shaft. A limit slot corresponding to the limit pin is positioned between the claw portion and the wind resistor, enabling the movable member to move within the body portion.

10 Claims, 7 Drawing Sheets

FAN BRAKE MECHANISM

This application claims the priority benefit of Taiwan patent application number 113143400 filed on Nov. 12, 2024, the disclosure of which is hereby incorporated by reference in its entirety.

FIELD OF THE INVENTION

The present invention relates to a fan brake mechanism, and more particularly, to a fan brake mechanism having a wind resistor, a hook portion, and a claw portion.

BACKGROUND OF THE INVENTION

With the rapid advancement of technology, the computing performance of electronic equipment has significantly improved, resulting in increased heat generation. To prevent damage caused by high temperatures, heat dissipation devices, such as fans, are commonly installed. When one of the multiple fans in a heat dissipation system becomes damaged and ceases operation, the fluid pressure at the damaged fan's location drops below the internal fluid pressure of the equipment. According to the principles of fluid mechanics, fluid flows from areas of higher pressure to lower pressure, causing internal airflow to escape through the damaged fan. This reverse airflow drives the stopped fan to rotate in reverse, further expelling internal airflow and leading to a sharp decline in cooling performance. To address this issue, a brake system can be installed on the fan to prevent reverse rotation and maintain effective cooling performance.

The following are the main methods of fan braking:
1. Software-Controlled MOS Braking During power-on, the software controls the MOS to remain normally open. The magnetic field generated by the fan blades interacts with the magnetic field of the magnetic tape, creating resistance.
2. Magnetic Field Resistance Braking When power is turned off, the magnetic field generated by the rotating fan blades interacts with the magnetic field of the magnetic strips, resulting in resistance and braking.
3. Solenoid Valve-Controlled Braking The brake mechanism is controlled by a solenoid valve powered directly by the fan's power supply. During normal operation, the solenoid valve remains normally open, keeping the shaft disengaged from the brake mechanism. When the fan loses power, the solenoid valve deactivates, and a spring drives the brake mechanism to engage the shaft, creating resistance.

Regardless of the type of fan braking structure described above, these designs require either the addition of dedicated braking circuits to the existing circuit boards or the installation of microprocessors with braking mode functionality to achieve the desired braking effect. For fan brake module designs, significant modifications to the fan's inherent structure are often necessary. Additionally, the circuit boards of fans are already densely populated with various circuits, making it impractical to directly integrate additional braking circuits or drive logic circuits onto the existing boards. This forces industry to redesign the circuit boards, leading to increased manufacturing complexity and operational challenges.

In view of this, how to address the above problems and shortcomings is the direction of urgent research.

SUMMARY OF THE INVENTION

The present invention is to provide a fan brake mechanism designed for efficient operation. During normal fan operation, the fan blades rotate in the forward direction. The thrust generated by the wind resistor counteracts the centrifugal force, causing the movable member to retract inward and prevent activation of the braking function. In the event of a fan failure, the fan blades rotate in the reverse direction. The centrifugal force causes the claw portion of the movable member to extend outward, engaging with the hook portion of the brake pawl. This engagement activates the fan brake mechanism, halting the reverse rotation of the failed fan and preventing it from disrupting airflow within the equipment. When the fan resumes normal operation, the extended claw portion disengages from the hook portion. It is pushed back along the inclined surface of the brake pawl, deactivating the braking function. This design enables repetitive braking functionality without requiring power supply to the fan brake mechanism or additional brake control circuits on the fan's circuit board. Moreover, the fan brake mechanism features a modular design, simplifying integration and eliminating the need to modify the original fan assembly.

The fan brake mechanism of an embodiment of the present invention includes a fan unit and a brake unit. The fan unit includes a frame and fan blades. The frame includes a vertically extending shaft barrel, and the fan blades are vertically mounted on a shaft. One end of the shaft is pivotally mounted to the fan blades, and another end of the shaft is positioned within the shaft barrel and has a pivot portion. The brake unit is disposed at the bottom of the frame. The brake unit includes a brake base and a brake module, and the brake base is provided with brake pawls. The brake module includes a body portion, at least one movable member accommodated within the body portion, and a limit pin corresponding to the movable member. The body portion is defined with a through groove that correspondingly engages with the pivot portion to pivotally mount the brake module on the shaft. One end of the movable member has a claw portion, another end of the movable member is provided with a wind resistor, and a limit slot corresponding to the limit pin is defined between the claw portion and the wind resistor. The movable member is movably accommodated within the body portion.

According to an embodiment of the present invention, the brake base includes a base and a flange portion, the brake pawls are disposed on an inner surface of the flange portion, and the brake module is accommodated within the brake base.

According to an embodiment of the present invention, the wind resistor includes a plug-in member and a wind-block piece, with the wind-block piece connected to the movable member through the plug-in member.

According to an embodiment of the present invention, the brake pawls are arranged in pairs.

According to an embodiment of the present invention, the brake base further includes a fitting portion provided on an outer edge of the base and configured to mate with a bottom opening of the shaft barrel.

According to an embodiment of the present invention, the wind-block piece includes a first plane facing the end of the movable member having the claw portion, and as the fan blades rotate forward, the shaft drives the brake module to rotate forward, and the first plane is subjected to an airflow thrust to cause the claw portion to retract inwardly without contacting the brake pawls until a side of the limit slot closer to the claw portion rests against the limit pin.

According to an embodiment of the present invention, the wind-block piece includes a second plane facing away from the end of the movable member having the claw portion, as the fan blades rotate in a reverse direction, the shaft drives the brake module to rotate in the reverse direction, the second plane is subjected to an airflow thrust and centrifugal force, pushing the claw portion outward until a side of the limit slot farthest from the claw portion rests against the limit pin, and causing the claw portion to engage with a respective brake pawl.

According to an embodiment of the present invention, each brake pawl includes an inclined surface and a hook portion, the inclined surface being tilted in a forward direction toward the shaft, and when the fan blade rotates in a reverse direction and then resumes the forward direction, the claw portion detaches from the hook portion and is pushed back and restored via the inclined surface.

According to an embodiment of the present invention, a curved section is further provided between the claw portion and the wind resistor, the end provided with the wind resistor and the end having the claw portion form an L-shaped structure via the curved section.

According to an embodiment of the present invention, the fan unit further includes an upper bearing and a lower bearing, and the upper bearing and the lower bearing are provided within the shaft barrel for supporting the shaft.

According to the fan brake mechanism disclosed in the above embodiment, when the fan operates normally, the fan blades rotate forward, and the shaft will drive the brake module to rotate forward. The first plane of the wind-block piece facing the end of the movable member having the claw portion is subjected to an airflow thrust to cause the claw portion to retract inwardly without contacting the brake pawls until a side of the limit slot closer to the claw portion rests against the limit pin. When the fan fails and cannot operate normally while other fans continue to operate, the return airflow causes the fan blades to rotate in a reverse direction, driving the shaft and brake module to rotate in the same direction. As a result, the second plane of the wind-block piece, facing away from the end of the movable member having the claw portion, is subjected to an airflow thrust and centrifugal force. These forces push the claw portion outward until the side of the limit slot farthest from the claw portion rests against the limit pin, thereby engaging with the hook portion and activating the braking function. Therefore, the failed fan will cease rotating in the reverse direction, preventing it from disrupting airflow within the device and avoiding a sudden drop in cooling performance. Additionally, when the fan resumes normal operation and the fan blades transition from reverse to forward rotation, the claw portion disengages from the hook portion and retracts along the inclined surface of the brake pawl on the brake base.

The present invention, through the aforementioned technical solution, achieves a repetitive braking function without requiring a power supply to drive the fan brake mechanism or adding a brake control function to the fan circuit board.

Additionally, the fan brake mechanism in this case adopts a modular design, allowing it to be installed onto the fan at a later stage. This ensures excellent compatibility and versatility without requiring any changes to the original fan assembly process.

The above description of the content of the present invention, along with the following description of the embodiments, is intended to demonstrate and explain the principles of the invention and to provide further clarification of the scope of the patent application for the invention.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

The above objects of the present invention and its structural and functional features will be illustrated in accordance with the preferred embodiments of the accompanying drawings.

Figure 1A:
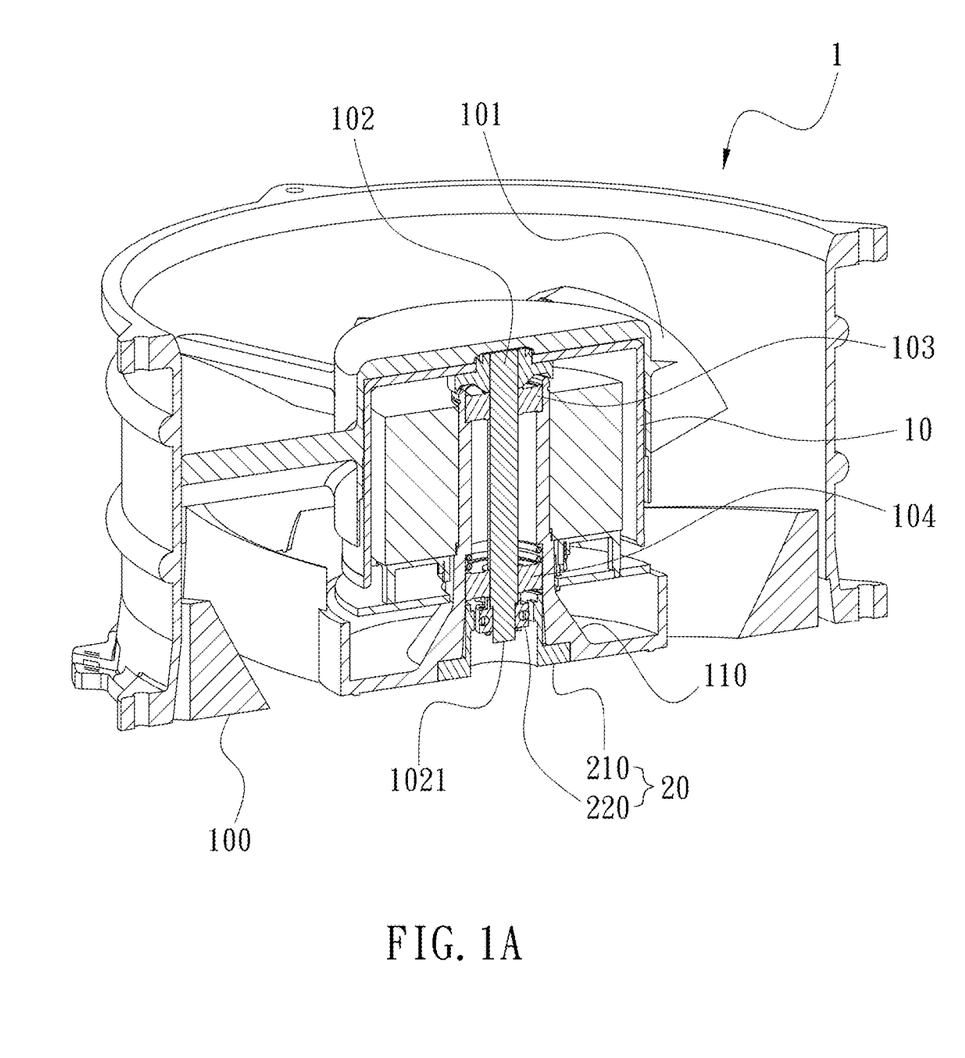
FIG. 1A is a cross-sectional schematic diagram of a fan brake mechanism according to an embodiment of the present invention.
Figure 1B:
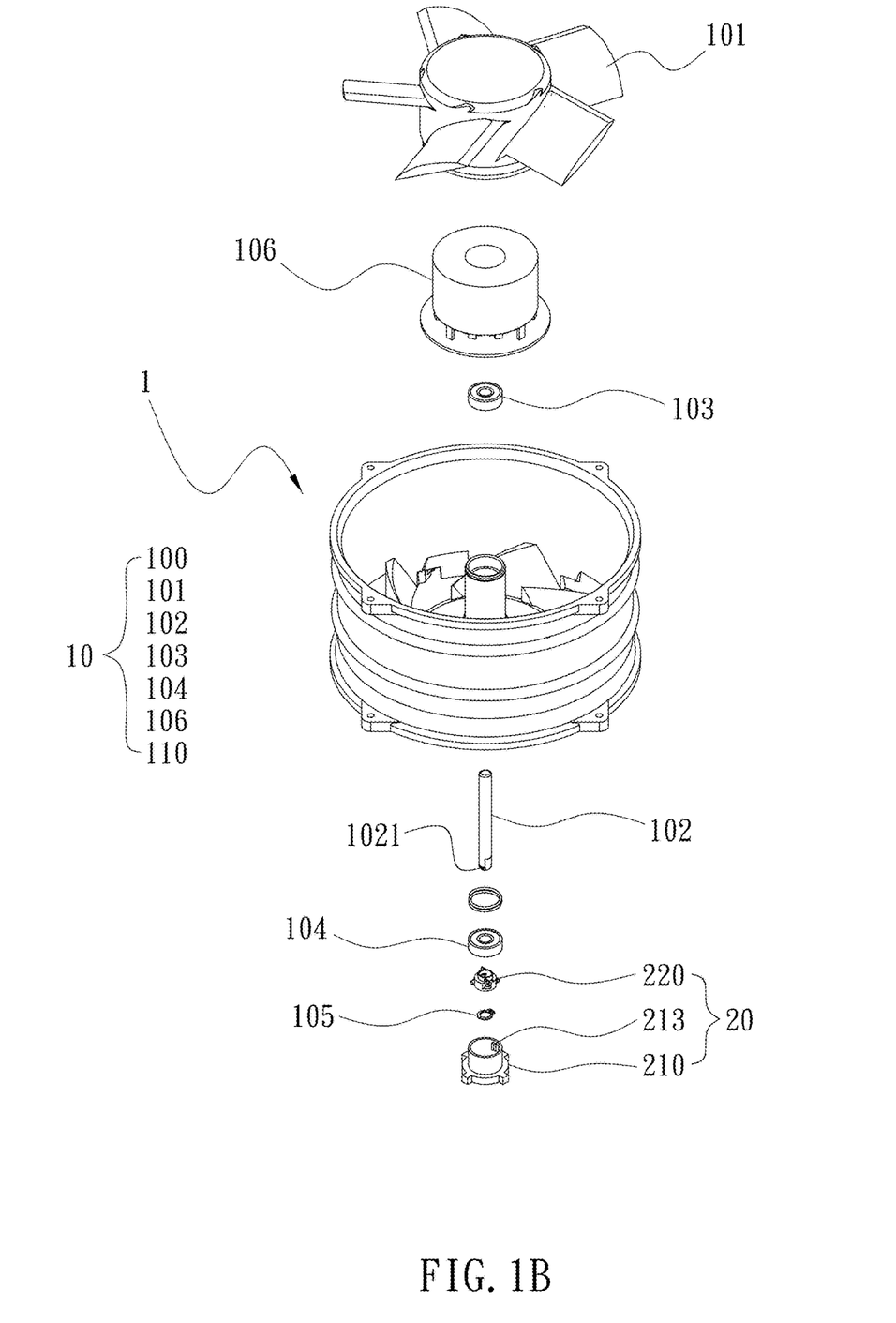
FIG. 1B is an exploded schematic diagram of the fan brake mechanism shown in FIG. 1A.

Please refer to FIGS. 1A and 1B. FIG. 1A is a cross-sectional schematic diagram of a fan brake mechanism according to an embodiment of the present invention, and FIG. 1B is an exploded schematic diagram of the fan brake mechanism shown in FIG. 1A. As shown in FIG. 1A, the fan brake mechanism 1 of this embodiment includes a fan unit 10 and a brake unit 20. The fan unit 10 includes a frame 100 and fan blades 101. The frame 100 may be made of metal or plastic material, with a vertically positioned shaft barrel 110 installed on the base of the frame 100. The shaft barrel 110 houses an upper bearing 103 and a lower bearing 104 to support the shaft 102.

The fan blades 101 are vertically mounted on the shaft 102, with one end of the shaft 102 pivotally connected to the fan blades 101. The other end of the shaft 102 is positioned within the shaft barrel 110 and has a pivot portion 1021. The pivot portion 1021 may be designed as a flat key-type pivot portion or a flat-type pivot portion extending beyond the lower bearing 104. However, the present invention is not limited to these configurations.

Please refer to FIG. 1B. In addition to the aforementioned frame 100, fan blades 101, shaft 102, upper bearing 103, lower bearing 104, and shaft barrel 110, the fan unit 10 also includes a rotor (not shown) and a stator assembly 106. Additionally, a buckle 105 may be installed between the brake module 220 and the shaft 102 to serve as a positioning component.

Figure 2:
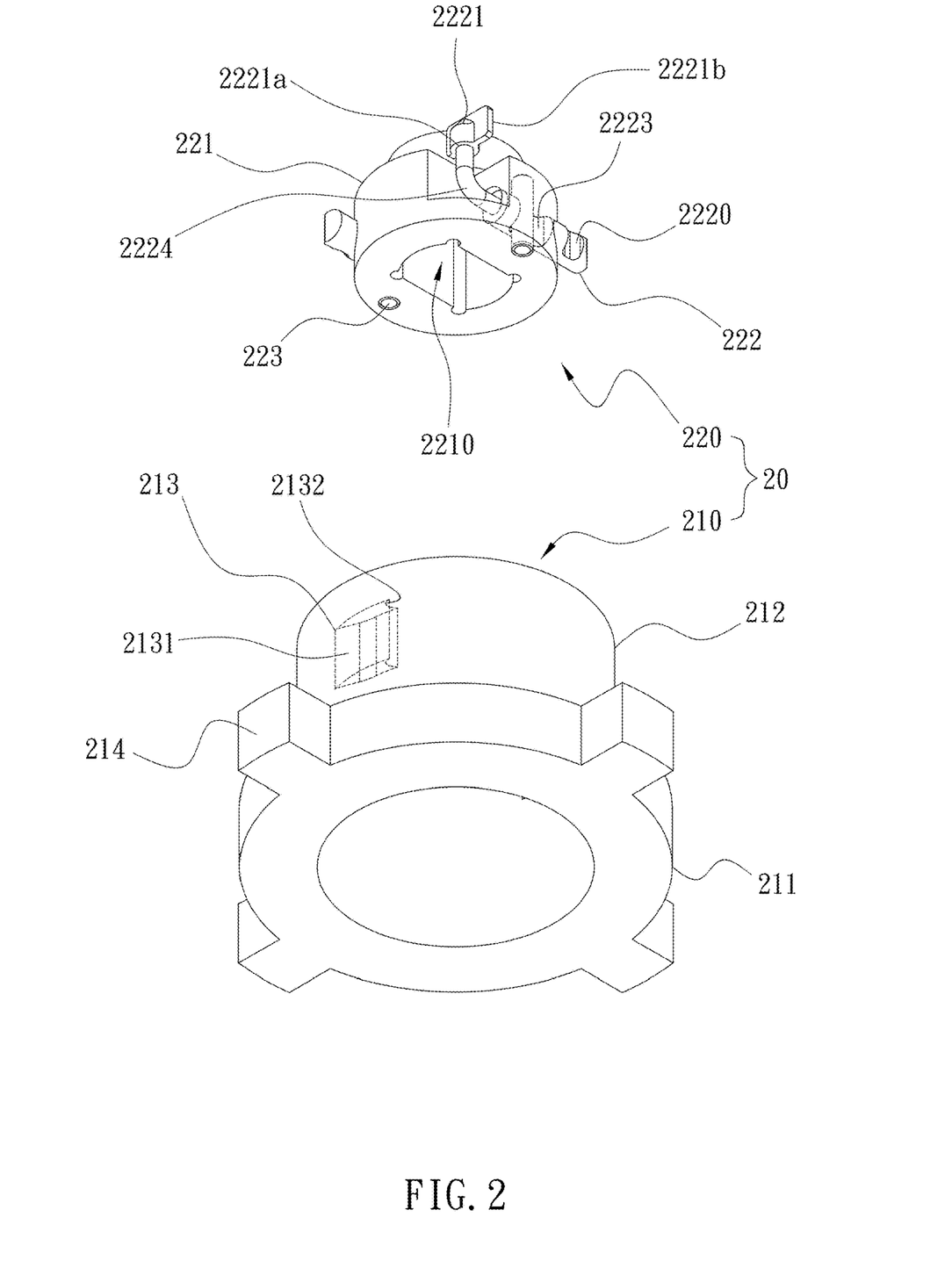
FIG. 2 is a perspective schematic diagram of the brake base and brake module shown in FIG. 1A.

Please refer to FIG. 2, which is a perspective schematic diagram of the brake base and brake module shown in FIG.

1A. The brake unit 20 includes a brake base 210 and a brake module 220. As shown at the bottom of FIG. 2, the brake base 210 in this embodiment includes a base 211, which may be, for example, an annular base. On the outer side of the base 211, a fitting portion 214 is provided. The fitting portion 214 may, for example, consist of multiple outwardly protruding components. The inner edge of the base 211 extends axially to form a hollow cylindrical flange portion 212. On the inner surface of the flange portion 212, a pair of brake pawls 213 is provided (the other brake pawl on the opposite side is not shown in the figure). Each brake pawl 213 may include an inclined surface 2131 and a hook portion 2132. Please refer to the upper portion of FIG. 2. In this embodiment, the brake module 220 includes a body portion 221, a pair of movable members 222, and a pair of limit pins 223 arranged opposite the movable members 222. The body portion 221 may be made of metal. At the central position of the body portion 221, a through groove 2210 is formed, which can, for example, be a polygonal groove structure. The through groove 2210 is designed to correspondingly engage with the pivot portion 1021 shown in FIG. 1A, allowing the brake module 220 to be pivotally mounted on the shaft 102. Because the pivot portion 1021 and the through groove 2210 of the body portion 221 correspondingly engage, the torque generated by the rotation of the fan blades 101 can drive the brake module 220 to rotate. The limit pins 223 are installed through the outer periphery of the body portion 221.

The movable member 222 can, for example, be housed within a through groove positioned on the side of the body portion 221. One end of the movable member 222 is equipped with a claw portion 2220, while the other end is fitted with a wind resistor 2221. The wind resistor 2221 includes a plug-in member 2221a and a wind-block piece 2221b, with the wind-block piece 2221b engaging the movable member 222 via the plug-in member 2221a. Between the claw portion 2220 and the wind resistor 2221, there is a curved section 2224. This curved section 2224 enables the movable member 222 to form an L-shaped structure, with one end connected to the wind resistor 2221 and the other end to the claw portion 2220. Additionally, a limit slot 2223 is provided between the claw portion 2220 and the curved section 2224. The limit slot 2223 is positioned opposite the limit pin 223. By aligning the limit slot 2223 of the movable member 222 with the limit pin 223 installed through the body portion 221, the movable member 222 is movably constrained within the body portion 221.

Figure 3:
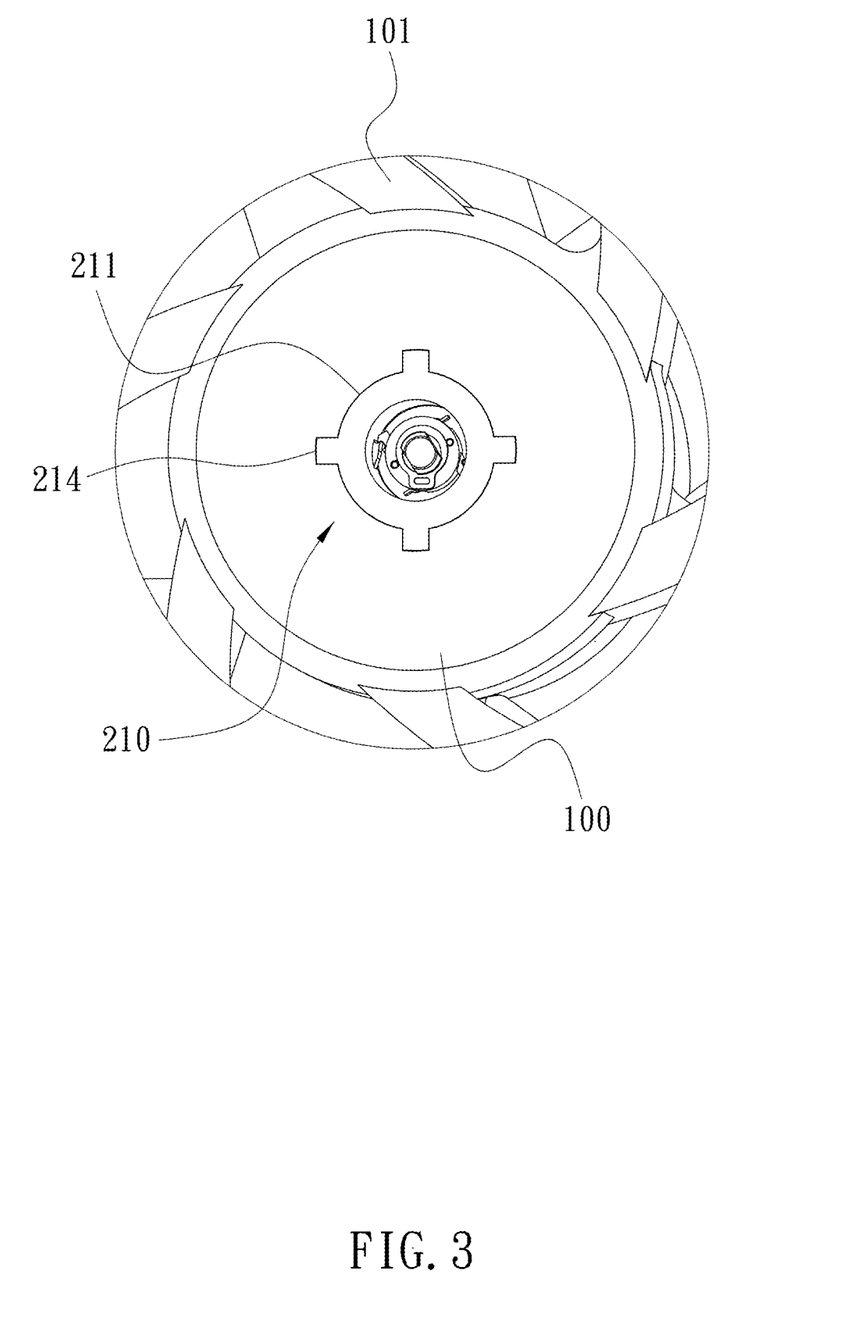
FIG. 3 is a bottom view schematic diagram of the brake base installed on the fan frame according to an embodiment of the present invention.

Please refer to FIG. 3. FIG. 3 is a bottom view schematic diagram of the brake base installed on the fan frame according to an embodiment of the present invention. As shown in FIG. 3, the fitting portion 214 of the brake base 210 in this embodiment includes multiple components protruding outward from base 211. The brake base 210 is fixed to the bottom of the frame 100 by engaging the fitting portion 214 with the bottom of the frame 100. The structure and number of the fitting portions 214 can be adjusted based on the shape of the opening at the bottom of the frame. However, the present invention is not limited to these specific configurations.

Figure 4:
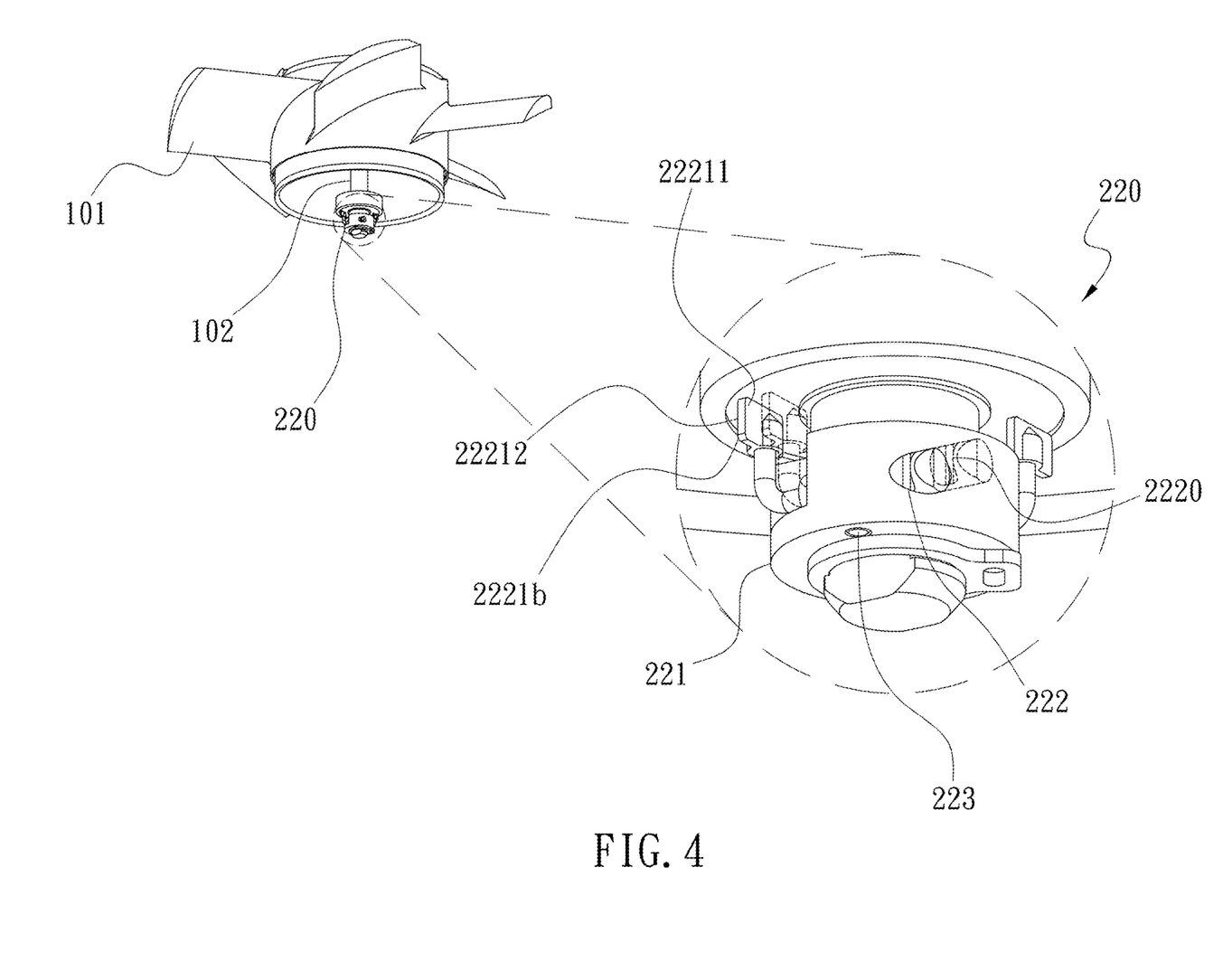
FIG. 4 is an operational schematic diagram of the claw portion of the movable member within the brake module according to an embodiment of the present invention.
Figure 5A:
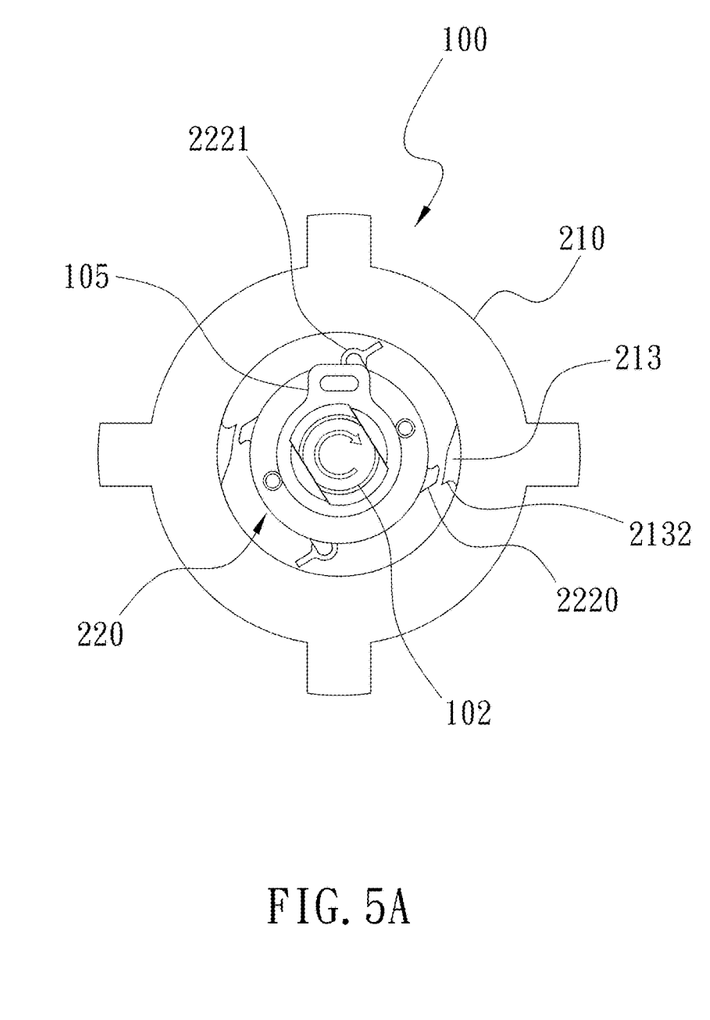
FIG. 5A is a schematic diagram showing the retracted claw portion of the brake module in FIG. 4, as observed from the bottom of the fan frame.
Figure 5B:
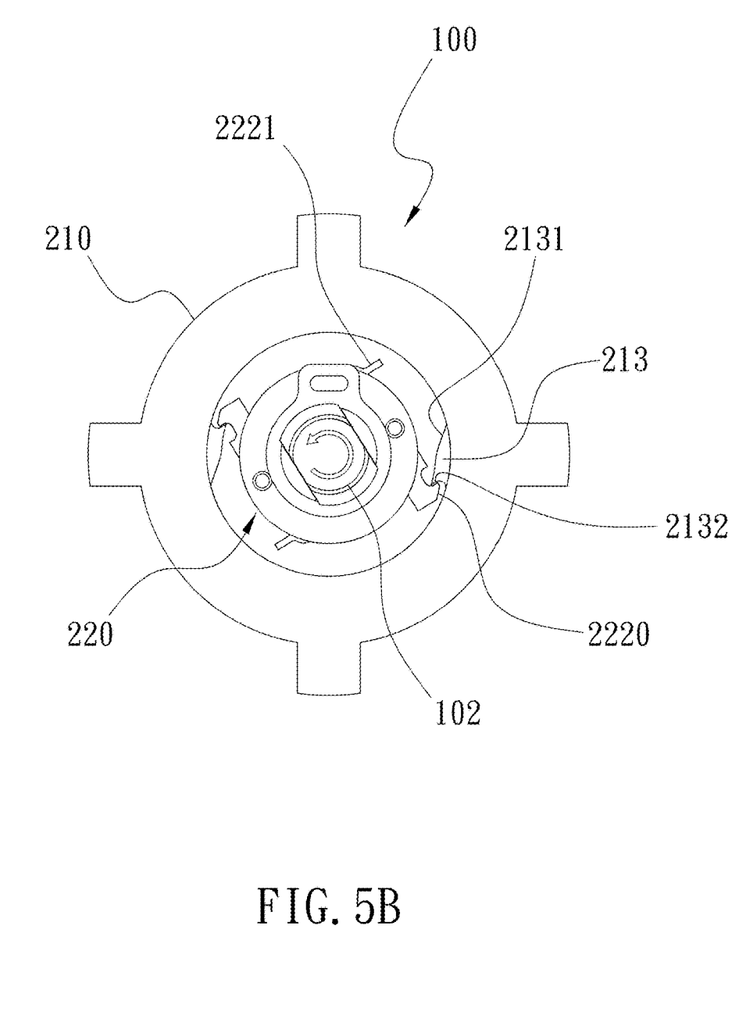
FIG. 5B is a schematic diagram showing the extended claw portion of the brake module in FIG. 4, as observed from the bottom of the fan frame.

Please refer to FIGS. 4, 5A, and 5B. FIG. 4 is an operational schematic diagram of the claw portion of the movable member within the brake module according to an embodiment of the present invention. FIG. 5A is a schematic diagram showing the retracted claw portion of the brake module in FIG. 4, as observed from the bottom of the fan frame. FIG. 5B is a schematic diagram showing the extended claw portion of the brake module in FIG. 4, as observed from the bottom of the fan frame.

Please refer to FIG. 4 and FIG. 5A. When the fan operates normally, the fan blades 101 rotate in the forward direction. Since the brake module 220 is pivotally mounted on the shaft 102, the shaft 102 drives the brake module 220 to rotate in the forward direction. This causes the first plane 22211 of the wind-block piece 2221b, which faces the claw portion 2220, to be subjected to an airflow thrust. This airflow thrust is greater than the centrifugal force generated by the rotation of the brake module 220, which would otherwise cause the movable member 222 to extend outward. As a result, the claw portion 2220 of the movable member 222 retracts inward toward the limit pin 223.

As shown in FIG. 5A, the inward retraction of the claw portion 2220 prevents it from engaging with the hook portion 2132 of the brake pawl 213 on the brake base 210. This mechanism ensures that the braking function is not triggered when the fan is operating normally.

Please continue referring to FIG. 4 and FIG. 5B. In another embodiment, when the fan fails, the fluid pressure at the failed fan location becomes lower than the fluid pressure inside the equipment (due to other fans operating normally, not shown in the figures). According to fluid dynamics principles, fluid flows from high-pressure areas to low-pressure areas, resulting in reverse airflow at the failed fan location (not shown), causing the fan blades 101 to rotate in the reverse direction. Consequently, the shaft 102 drives the brake module 220 to rotate in the reverse direction. At this time, the second plane 22212 of the wind-block piece 2221b, which faces away from the claw portion 2220, is subjected to an airflow thrust. Combined with the effect of centrifugal force, this causes the claw portion 2220 of the brake module 220 to be flung outward from the body portion 221 (indicated by the dashed lines in FIG. 4). This outward movement continues until the side of the limit slot 2223 farthest from the claw portion 2220 comes into contact with the limit pin 223 (refer to the upper portion of FIG. 2 for the brake module 220). As shown in FIG. 5B, the outward extension of the claw portion 2220 of the movable member 222 in the brake module 220 allows it to engage with the hook portion 2132 of the brake pawl 213 on the brake base 210, thereby activating the braking function. It is important to note that in this embodiment of the invention, forward rotation (or the forward direction) refers to a clockwise rotation when observed from the bottom of frame 100 facing the brake unit 20. Conversely, reverse rotation (or the reverse direction) refers to a counterclockwise rotation from the same perspective. Of course, the definitions of forward and reverse rotation directions may vary depending on the actual design and requirements of the fan unit 10, and the invention is not limited to these specific definitions.

Figure 6A:
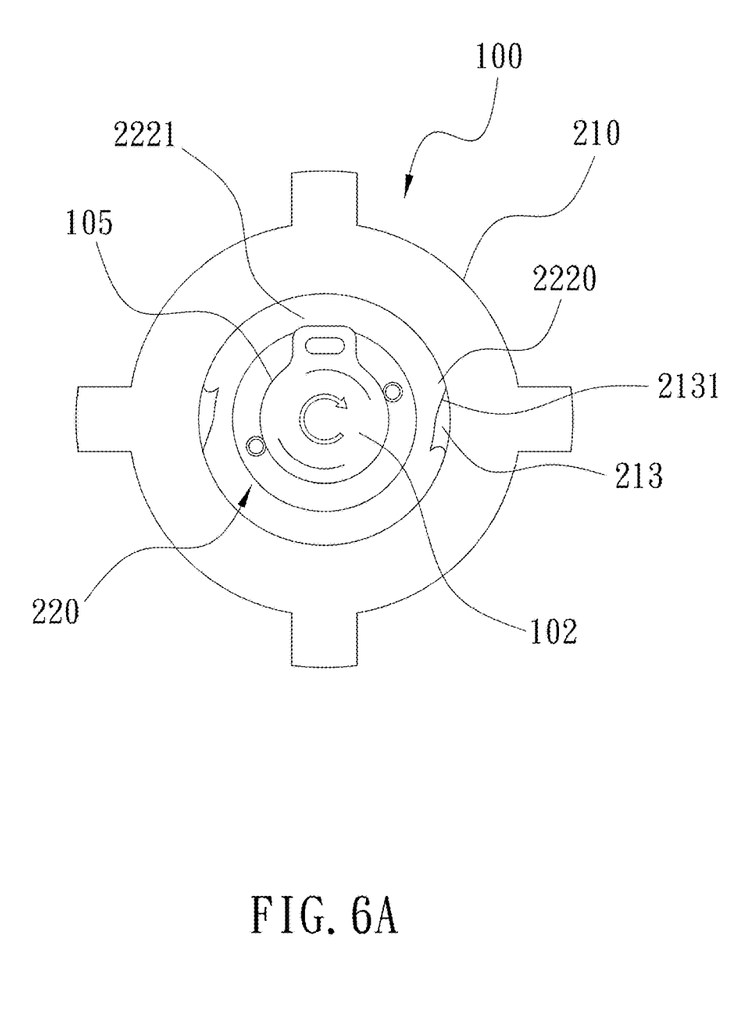
FIG. 6A is a schematic diagram illustrating the first stage of the claw portion disengaging from the brake pawl of the brake base according to an embodiment of the present invention.
Figure 6B:
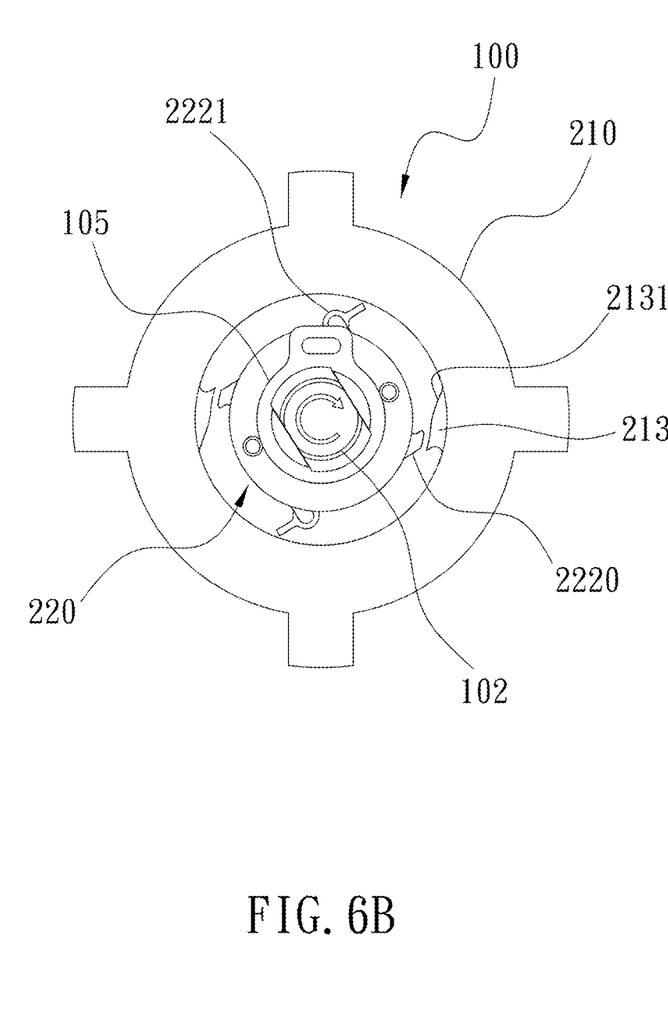
FIG. 6B is a schematic diagram illustrating the second stage of the claw portion disengaging from the brake pawl of the brake base according to an embodiment of the present invention.

Please refer to FIGS. 6A and 6B. FIG. 6A illustrates the first stage of the claw portion disengaging from the brake pawl of the brake base according to an embodiment of the present invention. FIG. 6B illustrates the second stage of the claw portion disengaging from the brake pawl of the brake base according to the same embodiment. Additionally, refer to FIGS. 5B, 6A, and 6B together. In this embodiment, when the fan resumes normal operation after being repaired, the fan blades 101 transition from reverse rotation back to forward rotation, driving the brake module 220 to rotate in the forward direction.

Since the brake pawls 213 on the brake base 210 in this embodiment are designed with inclined surfaces 2131 sloping toward the shaft direction in the forward (clockwise) rotation, the claw portion 2220 of the movable member 222 transitions from the engaged state with the hook portion 2132 as shown in FIG. 5B to the disengaged state shown in FIG. 6A. This disengagement is achieved by the inclined surface 2131 pushing the claw portion 2220 back to its original position. Subsequently, with the help of the wind resistor 2221, the claw portion 2220 transitions to the retracted state shown in FIG. 6B, where it no longer contacts the hook portion 2132 of the brake pawl 213. As a result, the braking function is canceled when the fan returns to normal operation.

Through the above-described technical solution, the present invention achieves the following functionality: during normal fan operation, the wind resistor converts the airflow thrust generated by the forward rotation of the fan into a counteracting force that resists the centrifugal force on the claw portion. This prevents the claw portion from being flung out of the body portion and triggering the braking function. When the fan fails, the reverse rotation of the fan blades causes the shaft to drive the brake module to rotate in the reverse direction. At this time, the wind resistor loses its counteracting force against the centrifugal force on the claw portion. Instead, it converts the reverse airflow thrust into a force that pushes the claw portion outward. The centrifugal force further flings the claw portion outward until it engages with the brake pawl of the brake base, thereby activating the braking function. When the fan is repaired and resumes normal operation, the fan blades return to forward rotation. The claw portion of the brake module disengages from the hook portion and is pushed back to its original position by the inclined surface of the brake pawl on the brake base, canceling the braking function. This design allows for repetitive braking functionality without requiring a power supply to drive the fan brake mechanism or adding a braking control function to the fan circuit board. Furthermore, the fan brake mechanism is modularized and can be installed in the final assembly stage of the fan, offering excellent compatibility and versatility without requiring modifications to the original fan assembly process.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A fan brake mechanism, comprising:
    a fan unit comprising a frame and fan blades, the frame comprising a vertically extending shaft barrel, the fan blades being vertically mounted on a shaft, one end of the shaft being pivotally mounted to the fan blades, and another end of the shaft being positioned within the shaft barrel and having a pivot portion; and
    a brake unit disposed at a bottom of the frame and comprising a brake base and a brake module, the brake base being provided with brake pawls, the brake module comprising a body portion, at least one movable member accommodated within the body portion, and a respective limit pin corresponding to each of the at least one movable member, the body portion being defined with a through groove that correspondingly engages with the pivot portion to pivotally mount the brake module on the shaft;
    wherein one end of each of the at least one movable member has a respective claw portion and another end of each of the at least one movable member is provided with a respective wind resistor, a respective limit slot corresponding to each respective limit pin is defined between the respective claw portion and the respective wind resistor, and each of the at least one movable member is movably accommodated within the body portion.

2. The fan brake mechanism of claim 1, wherein the brake base comprises a base and a flange portion, the brake pawls are disposed on an inner surface of the flange portion, and the brake module is accommodated within the brake base.

3. The fan brake mechanism of claim 2, wherein the brake base further comprises a fitting portion provided on an outer edge of the base and configured to mate with a bottom of the shaft barrel.

4. The fan brake mechanism of claim 1, wherein each of the respective wind resistor comprises a respective plug-in member and a respective wind-block piece, each of the respective wind-block piece is connected to one of the at least one movable member through the respective plug-in member.

5. The fan brake mechanism of claim 4, wherein the brake pawls are arranged in pairs.

6. The fan brake mechanism of claim 5, wherein each of the respective wind-block piece comprises a respective second plane facing away from the respective claw portion, as the fan blades rotate in a reverse direction, the shaft drives the brake module to rotate in the reverse direction, and the respective second plane is subjected to an airflow thrust and centrifugal force, pushing the respective claw portion outward until a respective side of the respective limit slot farthest from the respective claw portion rests against the respective limit pin, and causing the respective claw portion to engage with a respective brake pawl.

7. The fan brake mechanism of claim 5, wherein each brake pawl comprises a respective inclined surface and a respective hook portion, the respective inclined surface is tilted in a forward direction toward the shaft, and when the fan blades rotate in a reverse direction and then resume the forward direction, the respective claw portion detaches from the respective hook portion and is pushed back and restored via the respective inclined surface.

8. The fan brake mechanism of claim 4, wherein each of the respective wind-block piece comprises a respective first plane facing one of the respective claw portion, as the fan blades rotate forward, the shaft drives the brake module to rotate forward, and the first plane is subjected to an airflow thrust to cause the respective claw portion to retract inwardly without contacting the brake pawls until a respective side of the respective limit slot closer to the respective claw portion rests against the respective limit pin.

9. The fan brake mechanism of claim 1, wherein a curved section is further provided between the respective claw portion and the respective wind resistor of each of the at least one movable member, the end provided with the respective wind resistor and the end having the respective claw portion form an L-shaped structure via the curved section.

10. The fan brake mechanism of claim 1, wherein the fan unit further comprises an upper bearing and a lower bearing, and the upper bearing and the lower bearing are provided within the shaft barrel for supporting the shaft.

* * * * *